United States Patent
Pymento et al.

(10) Patent No.: US 9,769,924 B2
(45) Date of Patent: Sep. 19, 2017

(54) LAND GRID ARRAY INTERCONNECT FORMED WITH DISCRETE PADS

(71) Applicant: Lenovo Enterprise Solutions (Singapore) Pte. Ltd., Singapore (SG)

(72) Inventors: Larry G. Pymento, Cary, NC (US); Tony C. Sass, Fuquay Varina, NC (US); Paul A. Wormsbecher, Apex, NC (US)

(73) Assignee: Lenovo Enterprise Solutions (Singapore) Pte. Ltd., Singapore (SG)

(*) Notice: Subject to any disclaimer, the term of this patent is extended or adjusted under 35 U.S.C. 154(b) by 488 days.

(21) Appl. No.: 14/323,048

(22) Filed: Jul. 3, 2014

(65) Prior Publication Data

US 2014/0326491 A1    Nov. 6, 2014

Related U.S. Application Data

(62) Division of application No. 13/197,881, filed on Aug. 4, 2011, now Pat. No. 8,850,699.

(51) Int. Cl.
| | |
|---|---|
| *H05K 7/10* | (2006.01) |
| *H05K 7/12* | (2006.01) |
| *H05K 1/11* | (2006.01) |
| *H05K 3/40* | (2006.01) |
| *H05K 1/09* | (2006.01) |
| *H05K 3/34* | (2006.01) |

(52) U.S. Cl.
CPC ............ *H05K 1/112* (2013.01); *H05K 1/09* (2013.01); *H05K 3/4015* (2013.01); *H05K 3/3436* (2013.01); *H05K 2201/10719* (2013.01); *Y10T 29/49149* (2015.01); *Y10T 29/49155* (2015.01); *Y10T 29/49208* (2015.01)

(58) Field of Classification Search
USPC .................. 361/768; 174/257, 266, 261
See application file for complete search history.

(56) References Cited

U.S. PATENT DOCUMENTS

| | | | |
|---|---|---|---|
| 3,964,666 A | 6/1976 | Dinella et al. | |
| 4,875,617 A | 10/1989 | Citowsky | |
| 5,465,152 A | 11/1995 | Bilodeau et al. | |
| 5,468,995 A | 11/1995 | Higgins, III | |
| 5,646,068 A | 7/1997 | Wilson et al. | |
| 5,873,511 A | 2/1999 | Shapiro | |
| 6,175,151 B1 | 1/2001 | Hashimoto | |
| 6,229,207 B1 | 5/2001 | Master | |
| 6,518,649 B1 | 2/2003 | Iwane et al. | |

(Continued)

OTHER PUBLICATIONS

"Method for Three-Dimensional Solder Pads With a Solder-Mask Anchor" www.ip.com No. IPCOM000136944d, Jun. 5, 2006, 5 pages.

(Continued)

*Primary Examiner* — Andargie M Aychillhum
(74) *Attorney, Agent, or Firm* — Jeffrey L. Streets

(57) ABSTRACT

A land grid array (LGA) includes a grid array of metal pads plated directly onto a printed circuit board, and a discrete metal pad soldered to each of the plated metal pads in the grid array. Each discrete metal pad has an exposed contact surface after soldering, and a thickness of each discrete metal pad is selected as a function of location in the grid array so that the discrete pads provide a locus of exposed surfaces having greater flatness than the printed circuit board.

7 Claims, 6 Drawing Sheets

(56) References Cited

U.S. PATENT DOCUMENTS

| | | |
|---|---|---|
| 6,707,680 B2 | 3/2004 | Schaper |
| 7,732,002 B2 | 6/2010 | Kodas et al. |
| 7,847,399 B2 | 12/2010 | Masumoto |
| 2002/0132450 A1* | 9/2002 | Nose .................. H01L 21/4846 438/460 |
| 2009/0146301 A1* | 6/2009 | Shimizu .................. B29C 43/18 257/738 |
| 2010/0112195 A1 | 5/2010 | Kodas et al. |
| 2011/0045641 A1 | 2/2011 | Masumoto |

OTHER PUBLICATIONS

Akino et al. "Patent Abstracts of Japan—Publication No. 2001-210678 'Tape Carrier'", Hitachi Cable Ltd, Aug. 3, 2001, 7 pages.
Miyamoto et al. "Patent Abstracts of Japan—Publication No. 2002-026084 'Tape Carrier for Semiconductor Device and Its Manufacturing Method'", Hitachi Cable Ltd, Jan. 25, 2002, 9 pages.
Nguyen, Donghai D., "USPTO—Office Action" mailed on Dec. 20, 2013, 9 pages.

\* cited by examiner

LAND GRID ARRAY INTERCONNECT FORMED WITH DISCRETE PADS

CROSS-REFERENCE TO RELATED APPLICATIONS

This application is a divisional of U.S. patent application Ser. No. 13/197,881 filed on Aug. 4, 2011, which application is incorporated by reference herein.

BACKGROUND

Field of the Invention

The present invention relates to land grid arrays used to accommodate surface mount components and devices.

Background of the Related Art

A land grid array (LGA) is a physical and electrical structure on a printed circuit board that is adapted to receive a surface mount component or device, such as an integrated circuit. The land grid array includes a large number of pads that make electrical contact with pins, balls or other conductive structures of the surface mount component or device. Each pad is also in electrical communication with a conductive pathway, such as a conductive via and/or trace that leads to some other device or feature in or on the printed circuit board.

The performance of a surface mount component or device is dependent upon good electrical contact with each of the pads in the land grid array. However, the large number of contacts makes it imperative to manufacture the surface mount component or device and the land grid array to specific tolerances. Accordingly, it is desirable to provide a land grid array where the contact surfaces of the pads lie in a plane (i.e., a high degree of flatness). Unfortunately, other components, structures and feature of the printed circuit board may adversely affect the flatness of the printed circuit board upon which the land grid array is formed.

BRIEF SUMMARY

One embodiment of the present invention provides a land grid array includes a grid array of metal pads plated directly onto a printed circuit board, and a discrete metal pad soldered to each of the plated metal pads in the grid array. Each discrete metal pad has an exposed contact surface after soldering, and a thickness of each discrete metal pad is selected as a function of location in the grid array so that the discrete pads provide a locus of exposed surfaces having greater flatness than the printed circuit board.

DETAILED DESCRIPTION

Figure 1:
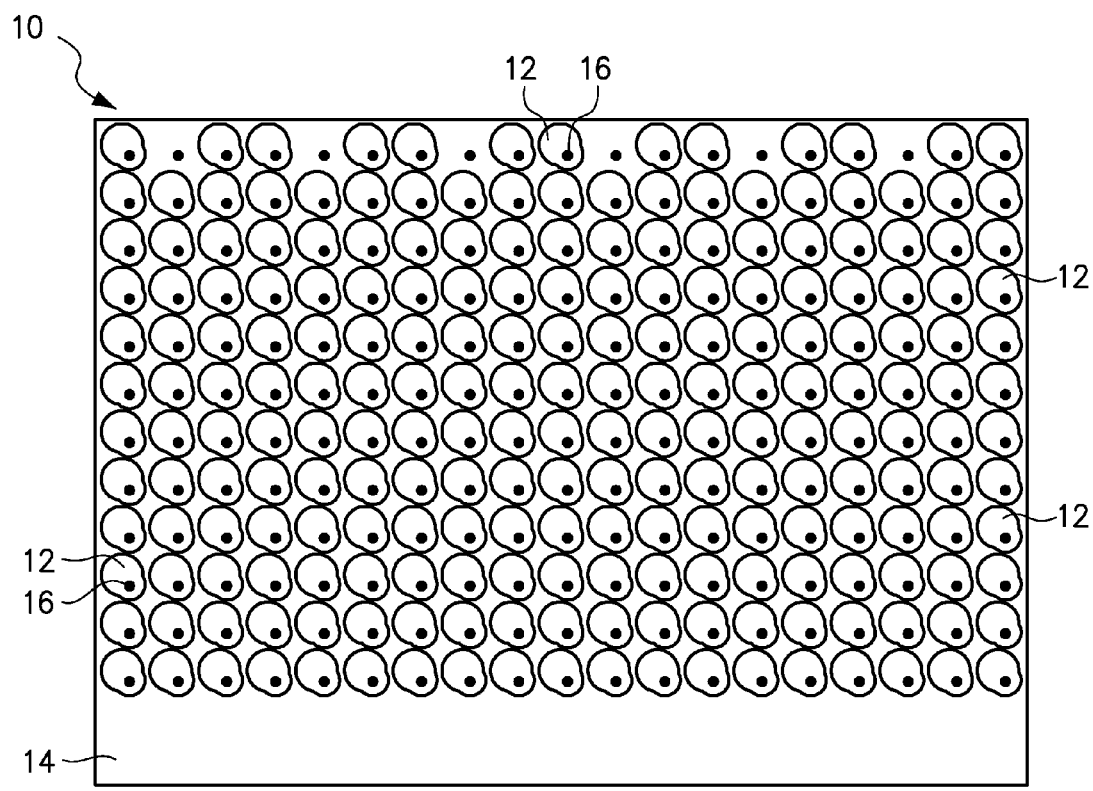
FIG. 1 is a plan view of a grid array formed by metal pads that have been plated directly onto the surface of a printed circuit board (PCB).

One embodiment of the present invention provides a method of forming a land grid array. The method comprises plating a printed circuit board to form a grid array of copper pads, and soldering a discrete pad over each of the plated copper pads in the grid array. The discrete pad is a solid object that can be handled and positioned independent of other discrete pads. For example, a discrete pad may cover a plated copper pad having a via through the printed circuit board and the plated copper pad.

Optionally, the method may further comprise measuring variations in flatness of the printed circuit board as a function of location in the grid array, and selecting individual discrete pads that each have a thickness selected for use at a particular location in the grid array so that the discrete pads provide a locus of exposed surfaces having greater flatness than the printed circuit board. When a printed circuit board is designed for use in a particular application, various components and features are formed or mounted on the circuit board. These component and features can impart or relieve stresses in the printed circuit board, thereby leading to a loss of flatness. However, the placement and geometry of the components and features is the same among a group of printed circuit boards designed and manufactured for a given purpose. As a result, the variation in flatness is substantially the same from one printed circuit board to the next for any given model of component. Therefore, measuring the flatness of a few test boards is a good approximation of the flatness of each subsequently manufactured board of the same design. Discrete pads of any particular thickness can be made to compensate for deviations from flatness and present a flat land grid array for receiving a surface mount component or device.

The selected discrete pads may be positioning individually (one-by-one) over the plated copper pads at the particular location, or positioned as a group over some or all of the plated copper pads in the grid array. For example, an array of the discrete pads may be positioning with a multiple nozzle vacuum tool that can pick up, place and release the discrete pads. In a second example, the method may include removably securing a plurality of the selected discrete pads onto a substrate, positioning the substrate over the grid array with the plurality of selected discrete pads aligned over the plated metal pads of the grid array, and removing the substrate and leaving the discrete pads in contact with the plated metal pads of the grid array. One such substrate is in the form of a tape that may be secured on a reel for ease of handling.

The discrete pads may take various forms, but are preferably pre-manufactured. While the discrete pads may be manufactured using one or more plating processes or steps, the discrete pads are physically secured to the printed circuit board. The discrete pads are, themselves, not plated onto the printed circuit board.

In various embodiments, the discrete pads may have a base metal core that is plated with one or more other metals. Although the base metal core may be made in various shapes, the preferred shape is a circular disk having two opposing flat surfaces and a perimeter edge. If the metals plating is kept at a generally constant thickness, the overall thickness of a discrete pad can be controlled by varying the thickness (i.e., distance between the two opposing surfaces) of the base metal core. In order to correct a printed circuit board for deviations from flatness, it may be necessary to have discrete pads of various thicknesses. A given discrete pad is made with an overall thickness that is selected for use at a particular location in the grid array.

In one specific example of a discrete pad, a base metal core is made of copper. The copper core is then plated with another metal, such as plating the copper core on all sides with nickel. A nickel (Ni) layer or barrier prevents copper migration and increases the durability of the discrete pad. One face or side (i.e., a proximal surface or underneath side) of the discrete pad may be plated with tin (Sn) to provide good wetting with the solder. Another face or side (i.e., an exposed contact surface) of the discrete pad may be plated with gold (Au) to provide high oxidation resistance and good electrical conductivity for contacting a surface mount component or device.

Another embodiment of the invention provides a land grid array comprising a grid array of metal pads plated directly onto a printed circuit board. The land grid array further comprises a discrete pad soldered to each of the plated metal pads in the grid array, wherein each discrete pad has an exposed contact surface after soldering, and wherein the locus of exposed surfaces of the discrete pads has greater flatness than the printed circuit board. Other aspects of the land grid array may be implemented as described above with respect to the manufacturing, selection, and use of discrete pads to correct for deviations in the flatness of a printed circuit board in the region of a land grid array.

FIG. 1 is a plan view of a grid array 10 formed by metal pads 12 that have been plated directly onto the surface of a printed circuit board (PCB) 14. In this grid array, there is a via 16 that extends into each of the metal pads 12. If the plated pads were used as a completed land grid array (LGA) in this condition, the via-in-pad construction can lead to various issues such as snagging or catching an LGA connector spring contact or allowing solder paste to enter the via well. Furthermore, to form a completed LGA, the plated copper pads need to be fully-encapsulated with a gold (Au) plating. The gold plating process for this situation is expensive.

Figure 2:
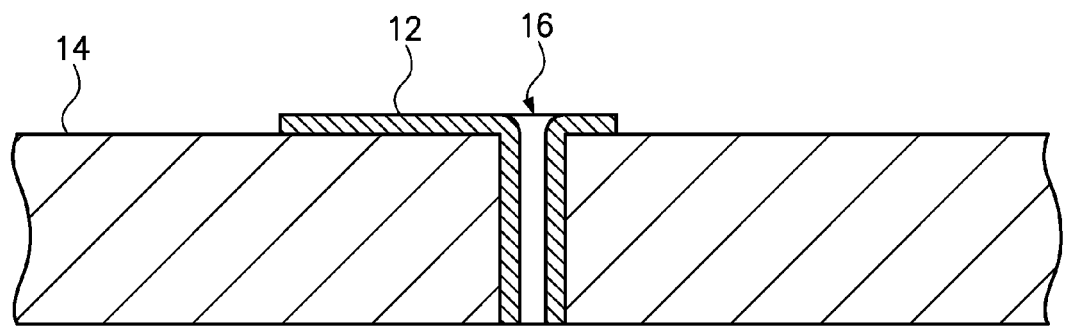
FIG. 2 is a cross-sectional side view of one pad and one via extending through the printed circuit board.

FIG. 2 is a cross-sectional side view of one pad 12 and one via 16 extending through the printed circuit board 14. It should be recognized that the via 16 may be more or less filled with conductive metal than is shown. However, the metal pad 12 has been plated directly onto the printed circuit board.

Figure 3:
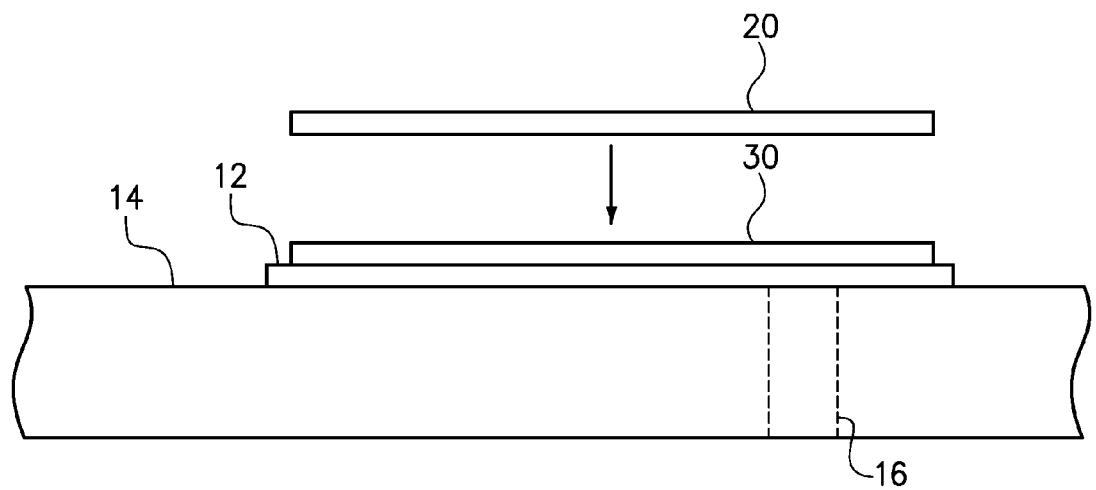
FIG. 3 is a side view of a printed circuit board receiving a pick-and-place pad.

FIG. 3 is a side view of the printed circuit board 14 receiving a discrete pad 20, alternatively referred to as a pick-and-place pad. A layer of solder paste 30 is disposed on the plated metal pad 12 for securing the discrete pad 20 in position. Once the pad is in position, the solder paste is heated until the solder liquefies and wets to a plated surface. Although there may still be a via 16 that extends into the plated metal pad 12 through the printed circuit board 14, the individual discrete pad 20 is positioned directly over the plated metal pad 12 and covers the via 16. The use of a discrete pad 20 in this manner eliminates all "via in pad issues."

Figure 4:
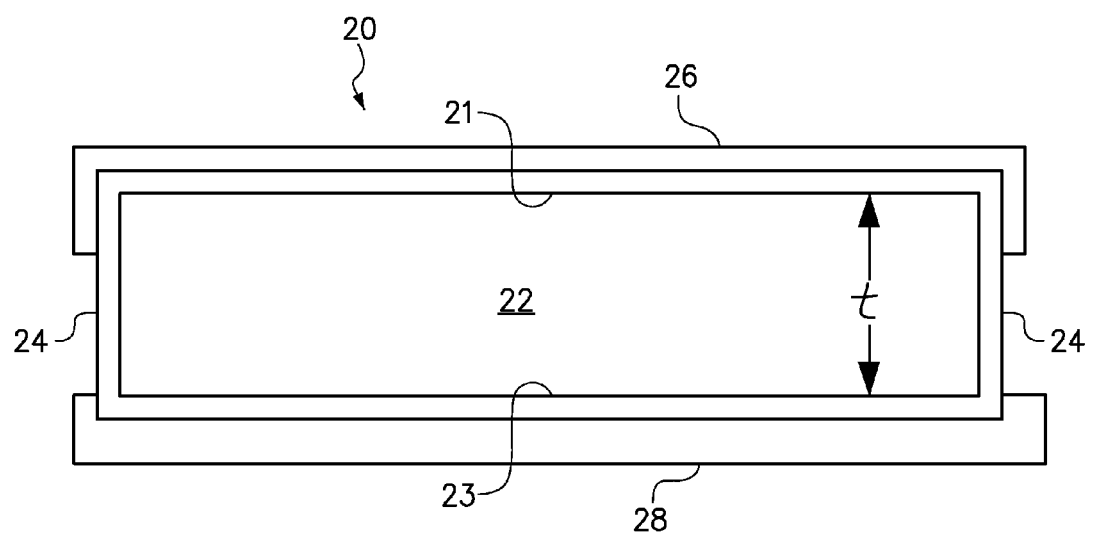
FIG. 4 is a cross-sectional side view of a pick-and-place pad.

FIG. 4 is a cross-sectional side view of a single, discrete (pick-and-place) pad 20. Although the construction of a discrete pad may vary, as described herein, a specific embodiment of a pad 20 will be described. As shown in FIG. 4, the discrete pad 20 has a core 22 with two opposing surfaces 21, 23 that are generally planar and parallel to each other. In a preferred form, the discrete pad 20 may be in the form of a disk, such as a circular disk.

The core 22 is preferably made of copper (Cu) for its high electrical conductivity. Accordingly, the copper core 22 is plated with a nickel (Ni) barrier 24 to prevent copper migration, while also increasing the durability of the PNP pad. One side of the discrete pad 20 has a layer of gold (Au) plating 26 over the nickel layer 24. The gold (Au) plating provides high oxidation resistance and good electrical conductivity, and forms an exposed contact surface for engaging a surface mount component or device. A second opposing side of the discrete pad 20 has a layer of tin (Sn) plating 28 over the nickel layer 24 to provide good wetting of solder.

A discrete pad, such as that shown in FIG. 4, provides a lower cost alternative to fully encapsulated Au pads formed by plating directly over the top of metal pads that are themselves plated onto the printed circuit board. The manufacture of discrete pads, as described herein, enables greater control of plating quality and facilitates high volume production of a single, simple part. Still, discrete pads may vary in construction as desired, such as having a thickness that varies from one discrete pad to the next to compensate for flatness deviations in a printed circuit board.

Figure 5:
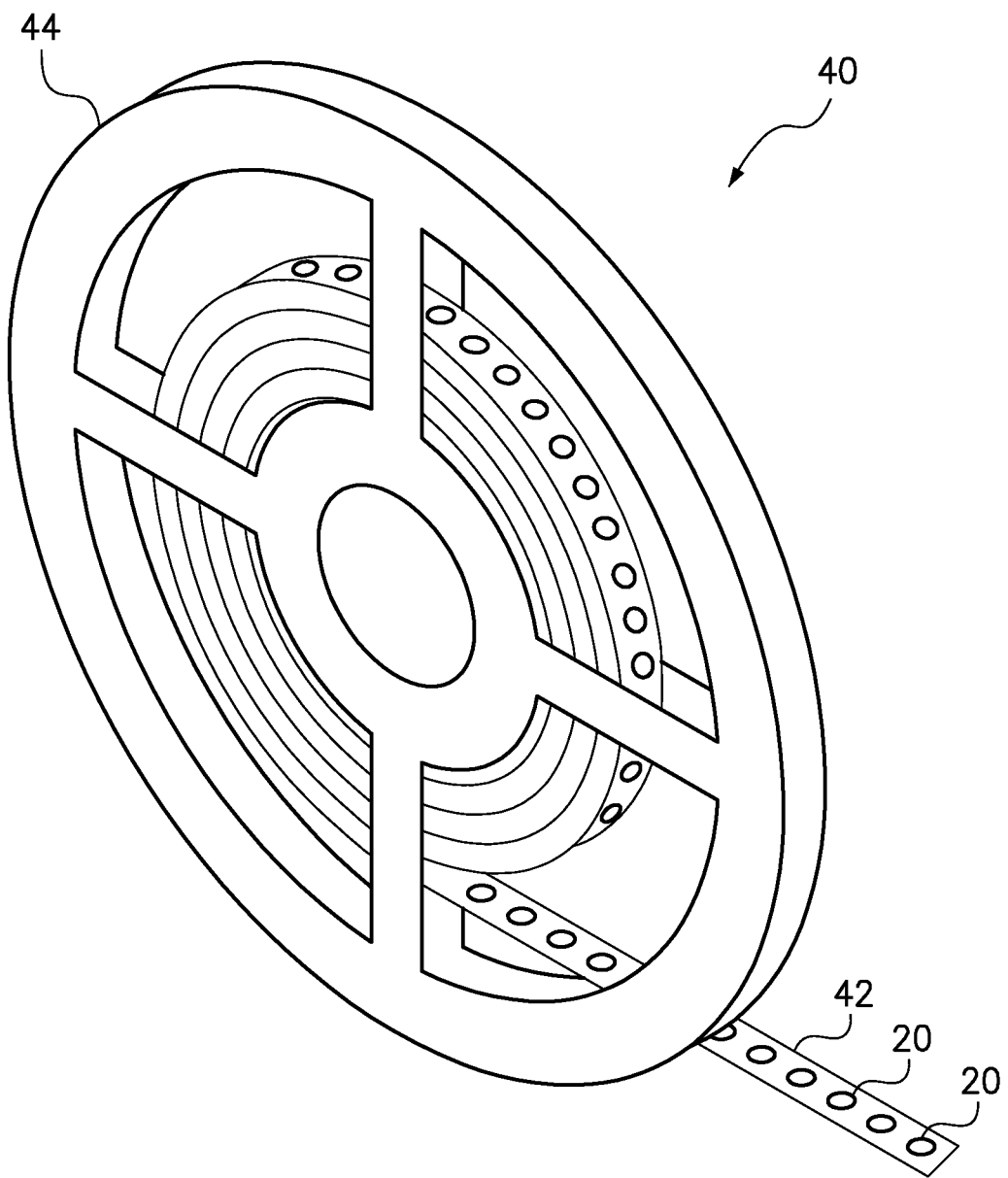
FIG. 5 is a reel of pick-and-place pads ready for placement on a printed circuit board.

FIG. 5 is a tape and reel package 40 providing a large number of discrete (pick-and-place) pads. The discrete pads 20 are removably secured to a ribbon-like "tape" 42 that is coiled on a reel 44. Depending on the situation, the pads may be individually removed from the tape and placed onto the plated pads or the tape may be used to place multiple discrete pads. There may be benefit to placing an array of pads at one time versus individual placement. However, based up the PCB flatness measurement and the selected thicknesses of discrete pads necessary to present a flat LGA for receiving a surface mount component, the pads of selected thickness must already be secured to the tape with the pads of selected thickness in the proper relative positions and spacing for placement at the proper location in the grid array. Accordingly, the tape may be marked with an indication of the location in the grid array where a particular discrete pad should be used.

Figure 6:
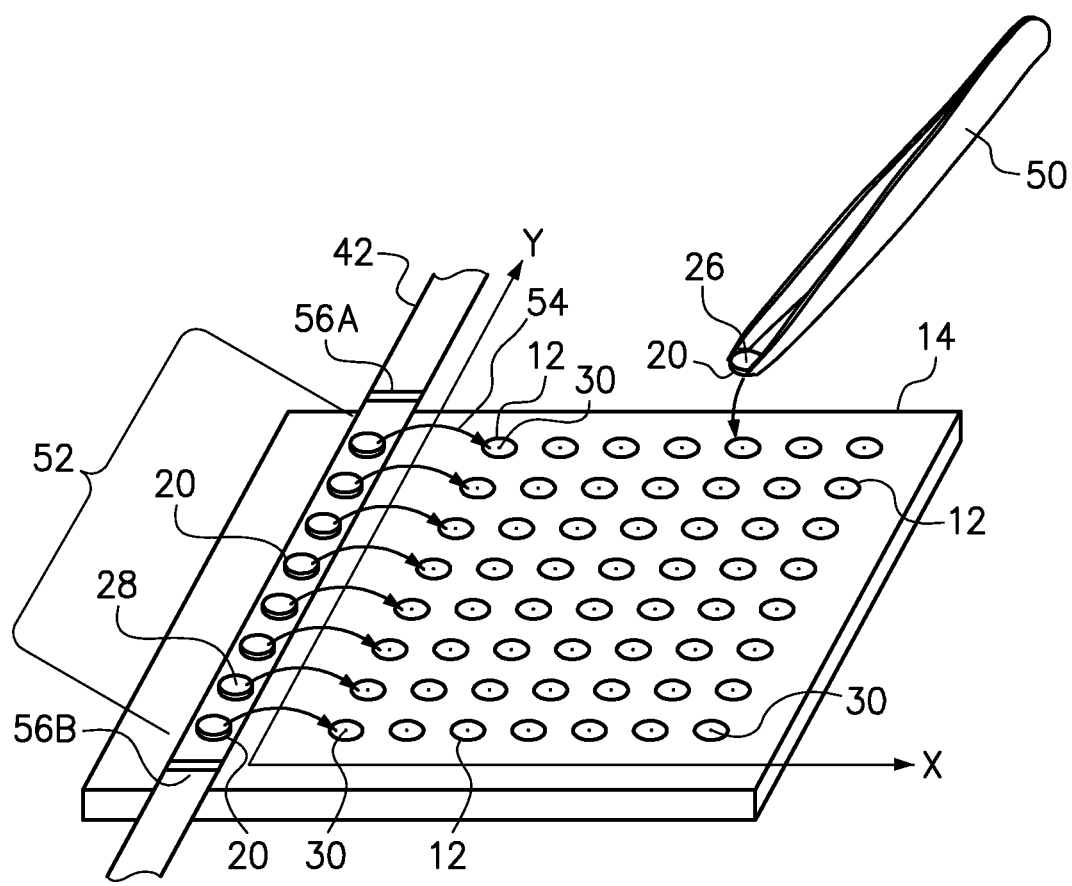
FIG. 6 is a perspective view of a land grid array on a printed circuit board, where pick-and-place pads are being secured.

FIG. 6 is a perspective view of a printed circuit board 14 having a grid array of plated metal pads 12 where discrete pads 20 are being secured. The discrete pads 20 may be individually placed with the gold layer 26 facing outward, such as using a manual or automated tool 50. Alternatively, a group 52 of discrete pads 20 may be positioned over the plated metal pads 12 at the same time. Here, the group 52 includes a row of eight (8) discrete pads 20. With the gold layer adjacent the tape 42, the tin layer 28 is exposed and may be flipped over (see arrows 54) by manipulating the tape so that the tin layer 28 contacts solder 30 on the plated metal pads 12. When the tape 42 has been removed, the discrete pads 20 will have the gold layer 26 exposed to form a contact surface for receiving a surface mount component of device. The tape 42 may include markings 56A, 56B that identify the location within the grid array where the discrete pads 20 should be positioned. Those having ordinary skill in the art will recognize that other systems for storing, delivering and positioning the discrete pads are available and suitable for use in the present methods. Perhaps the most viable system for placing the discrete pads in a manufacturing facility is a high speed pick and place machine with a vacuum nozzle. Such a machine is much more efficient and accurate than hand placement of the discrete pads.

Figure 7:
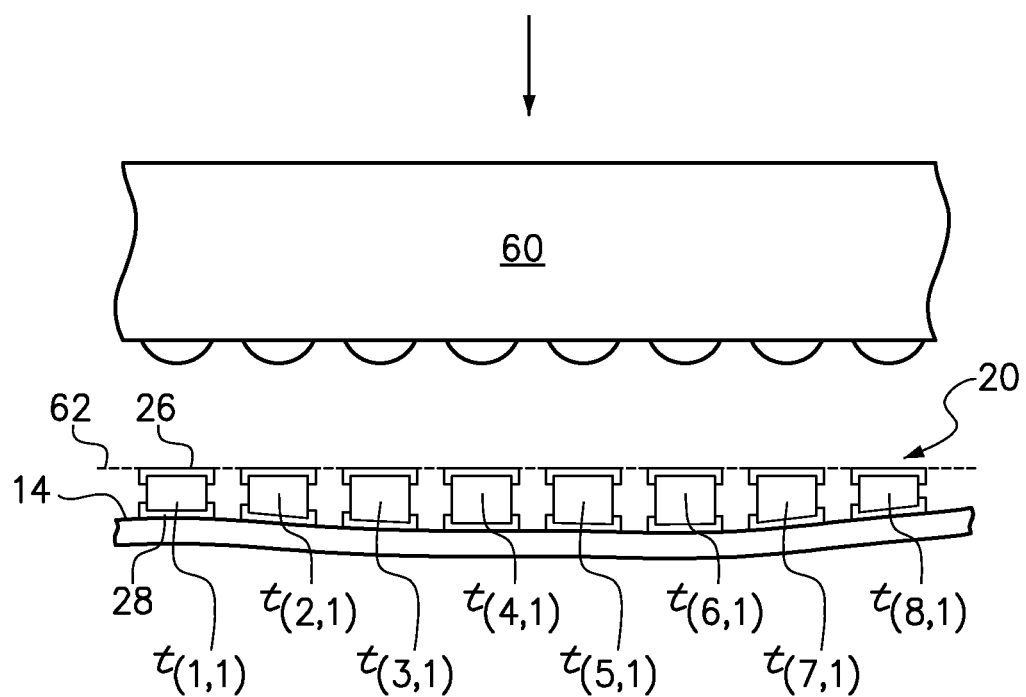
FIG. 7 is a side view of the printed circuit board in the area of a land grid array, where the thickness of the pick-and-place pads varies to provide a planar land grid array for receiving a surface mount component despite variations in the PCB profile.

FIG. 7 is a side view of the printed circuit board 14 in the area of a land grid array, where the thickness of the discrete (pick-and-place) pads 20 varies to provide a planar land grid array for receiving a surface mount component 60 despite deviations in the profile of the printed circuit board 14. Although the dimensions of the discrete pads 20 are not drawn to scale, FIG. 7 illustrates how the discrete pads 20 may be used to provide a land grid array having greater flatness than the flatness of the printed circuit board on which the land grid array is formed. As shown, the board 14 has a convex surface on which the LGA is formed. Based on a measurement of the deviation from flatness in the board 14, a plurality of discrete pads are designed and manufactured for a particular location in the grid array. The thickness of each discrete pad should be sufficient to be secured to the board (i.e., with tin layer 28 contacting the solder) at a given location in the grid, while positioning its exposed contact surface (i.e., the exposed surface of gold layer 26) in a plane 62. Although the goal is to provide a locus of exposed surfaces 26 lying in the plane 62, it is beneficial for the locus of exposed surfaces to exhibit any greater flatness than the printed circuit board.

Discrete pads in the middle of the convex surface will have a greater thickness than the discrete pads along one or more edges. Here, the discrete pads are identified by a thickness "t" that is appropriate for a given location identified by an x-y coordinate "(x,y)". It should be recognized that variations in flatness of the board (i.e., the z-direction), and the resulting differences in thickness of the discrete pads, may also occur in both the x-direction and the y-direction of the grid array.

It is possible that the total thickness of the discrete pads could be accommodated by modifying the socket to accept a surface mount component that will sit higher on the PCB. However, it is more likely that in any particular installation, the height delta will be handled with the mechanical hardware that secures the LGA connector.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A land grid array, comprising: a grid array of metal pads plated directly onto a printed circuit board having a plurality of conductive vias, wherein the plated metal pads cover the conductive vias; and a discrete metal pad soldered to each of the plated metal pads in the grid array with a layer of solder between the plated metal pads and each discrete metal pads and each discrete metal pad, wherein each discrete metal pad is positioned directly over one of the plated metal pads, wherein each discrete metal pad is positioned directly over one of the plated metal pads, wherein each discrete metal pad has an exposed contact surface after soldering, and wherein a thickness of each discrete metal pad is selected as a function of location in the grid array so that the discrete pads provide a locus of exposed surfaces having greater flatness than the printed circuit board.

2. The land grid array of claim 1, wherein the discrete metal pads have a base metal core plated with one or more metals.

3. The land grid array of claim 1, further comprising:
a via in a plurality of the plated metal pads, wherein the discrete metal pads cover the via.

4. The land grid array of claim 1, wherein the exposed contact surface of the discrete metal pads is plated with gold for contact with a surface mounted component.

5. The land grid array of claim 1, wherein the discrete pads have a copper core plated with another metal, and wherein the thickness of the copper core varies among the individual discrete pads.

6. The land grid array of claim 5, wherein the copper core is plated on all sides with nickel.

7. The land grid array of claim 5, wherein the discrete pads have a tin plated surface that is soldered to the plated copper pad.

* * * * *